(12) United States Patent
Kouwenhoven et al.

(10) Patent No.: US 7,084,714 B2
(45) Date of Patent: Aug. 1, 2006

(54) QUADRATURE MODULATOR AND DEMODULATOR

(75) Inventors: Michael Hendrikus Laurentius Kouwenhoven, Zoetermeer (NL); Chris Van Den Bos, Den Haag (NL); Michiel Van Nieuwkerk, Delft (NL); Christiaan Johannes Maria Verhoeven, Delft (NL)

(73) Assignee: Technische Universiteit Delft, Delft (NL)

( * ) Notice: Subject to any disclaimer, the term of this patent is extended or adjusted under 35 U.S.C. 154(b) by 42 days.

(21) Appl. No.: 10/470,074

(22) PCT Filed: Jan. 25, 2002

(86) PCT No.: PCT/NL02/00060

§ 371 (c)(1),
(2), (4) Date: Apr. 26, 2004

(87) PCT Pub. No.: WO02/060107

PCT Pub. Date: Aug. 1, 2002

(65) Prior Publication Data

US 2004/0178845 A1   Sep. 16, 2004

(30) Foreign Application Priority Data

Jan. 25, 2001   (NL) .................................. 1017191

(51) Int. Cl.
  *H03D 3/00*   (2006.01)
  *H03D 3/24*   (2006.01)
  *H03C 3/00*   (2006.01)

(52) U.S. Cl. ...................... 332/103; 329/304; 375/307

(58) Field of Classification Search ................. 375/307; 455/209, 316; 329/304; 332/103
See application file for complete search history.

(56) References Cited

U.S. PATENT DOCUMENTS

| 5,021,751 A | 6/1991 | Rose |
| 5,214,390 A * | 5/1993 | Montreuil .................. 329/309 |
| 5,233,315 A | 8/1993 | Verhoeven |
| 5,697,086 A * | 12/1997 | Svoboda ..................... 455/304 |
| 5,737,694 A * | 4/1998 | McMahill et al. ............ 455/76 |

FOREIGN PATENT DOCUMENTS

| EP | 0 738 053 | 10/1996 |
| WO | WO 00 48304 | 8/2000 |

* cited by examiner

*Primary Examiner*—Robert Pascal
*Assistant Examiner*—James Goodley
(74) *Attorney, Agent, or Firm*—Young & Thompson

(57) ABSTRACT

Quadrature demodulator and quadrature modulator which comprise a first oscillator and a second oscillator, a separate excitation signal being fed to the first and second oscillator to determine the time at which switching between two stable states takes place, and the quadrature demodulator and quadrature modulator further comprise excitation elements In the quadrature demodulator, an input signal is fed, which influences a parameter of one of the elements of the first and the second oscillator and produces a set of quadrature output signals. In the quadrature modulator, a first and second quadrature signals are fed to the quadrature modulator, which influences a parameter of one of the elements of the first and the second oscillator, and the quadrature modulator further comprises summing elements to produce a modulated output signal.

6 Claims, 4 Drawing Sheets

QUADRATURE MODULATOR AND DEMODULATOR

BACKGROUND OF THE INVENTION

The present invention relates to a quadrature modulator and demodulator comprising a linked oscillator circuit which contains a first oscillator and a second oscillator, wherein the first oscillator comprises a feedback amplifier and an integrator, an output of the feed-back amplifier is connected to an input of the integrator, and an output of the integrator is connected to an input of the feedback amplifier, the first oscillator has two stable states which alternate with one another in an oscillation period and a non-stable or regenerative state between the two stable stats, and a separate excitation signal is fed to the first oscillator in order to determine the point in time at which switching between the two stable states takes place, the second oscillator is identical to the first oscillator, and the quadrature demodulator further comprises first and second excitation means, respectively, which are arranged to derive an excitation signal for the second and the first oscillator, respectively, from an output signal from the first and the second oscillator, respectively.

Quadrature modulators and/or quadrature demodulators are needed for a multiplicity of circuits, such as in modern communications equipment (GSM telephones, DECT telephones, cable modems, etc.).

In existing quadrature modulators and demodulators use is made of separate mixing circuits or modulators and an oscillator. A mismatch in or between the mixing circuits leads to immediate disruption of the quadrature relationship between the in-phase signal I and the quadrature signal Q and thus to mutual crosstalk. The mixing circuits can be of the (double) balanced type or can be implemented by means of an analogue/digital converter or a circuit with switched capacitors. In the case of the balanced mixing circuits an offset can be reduced only by calibration. The other types are in general more accurate, but of more complex design and in general a digital correction can be employed. The oscillator for generating quadrature signals cans for example, be implemented by making use of a frequency divider or a (frequency-dependent) phase shift circuit However, oscillators of these types do not have an integral quadrature correction mechanism. Another type of oscillator tat can be employed makes use of a phase locked loop (PLL). In this case the two quadrature components do not have the same frequency characteristics ad the accuracy of the phase detector is the determining factor for the operation of the oscillator.

U.S. Pat. No. 5,939,951 discloses, for example, a method and device for modulating and demodulating a signal. The device comprises two feedback loops for generating output signal components from an input signal. Each loop comprises a voltage-controlled oscillator and a comparator for generating a control signal. An operating signal is generated in each loop, the signals from the two loops having a quadrature phase relationship.

The aim of the present application is to provide a quadrature motor and demodulator which does not display the abovemetioned disadvantages and maintains an accurate quadrature relationship.

SUMMARY OF THE INVENTION

Said aim is achieved by a quadrature demodulator of the type described in the pre-amble, wherein an input signal $S_i(t)$ is fed to the quadrature demodulator by means of which a parameter of one of the elements of the first and the second oscillator is influenced, the elements comprising the feedback amplifier, integrator or excitation means, and a set of quadrature output signals $I_o$, $Q_o$ is fed to the outputs of the respective one element that is associated with the influenced parameter.

By integrating the mixing circuits (multipliers) of the quadrature demodulator in a quadrature oscillator which generates two reference signals having a highly accurate quadrature relationship, a highly accurate quadrature demodulator is provided. The mixing circuits are implemented by varying a switching parameter of the quadrature oscillator at the speed of the signal to be demodulated In this case the quadrature control mechanism (feedback) of the oscillator also suppresses the effects of any mismatch of the mixing circuits to the quadrature relationship.

It is noted that U.S. Pat. No. 5,233,315 discloses a coupled regenerative oscillator circuit In this oscillator circuit an accurate quadrature phase relationship is maintained by means of a feedback loop.

In one embodiment the parameter is one of the following parameters:
a threshold level ($\gamma$) or an output level ($\delta$) of the feedback amplifier, or an integration constant ($\alpha$) of the integrator.

In a preferred embodiment the excitation means comprise a first and, respectively, second soft limiter circuit associated with the first and the second oscillator, respectively, and the parameter is the amplification (G) or the limit level ($\beta$) of the soft limiter circuit In this embodiment influencing the parameters of the soft limiter circuit has no influence on the zero passage detection of the soft limiter circuit, The function of the generation of an excitation signal for the other oscillator is thus not affected by influencing the one parameter. The multiplication function is now part of the negative feedback loop of the quadrature-coupled oscillator. It is advantageous to use the parameter $\beta$ of the soft limiter circuit as the parameter to be influenced, because in this case the output signal from the soft limiter circuit is to the parameter $\beta$. As a consequence the amplitudes of the (I and Q) quadrature signals also remain the same.

In a further aspect the present invention relates to a quadrature modulator comprising a linked oscillator circuit which contains a first oscillator and a second oscillator, wherein the fist oscillator comprises a feedback amplifier and an integrator, an output of the feedback amplifier is connected to an input of the integrator, and an output of the integrator is connected to an input of the feedback amplifier, the first oscillator has two stable states which alternate with one another in an oscillation period and a non-stable or regenerative state between the two stable states, and a separate excitation signal is fed to the first oscillator in order to determine the point in time at which switching between the two stable states takes place, the second oscillator is identical to the first oscillator, and the quadrature modulator further comprises first and second excitation means, respectively, which are arranged to derive an excitation signal for the second and the first oscillator, respectively, from an output signal from the first and the second oscillator, respectively, characterized in that a first quadrature signal and a second quadrature signal are fed to the quadrature modulator, by means of which signals a parameter of one of the respective elements of the first and the second oscillator is influenced, the elements comprising the feedback amplifier, integrator or excitation means, and the quadrature modulator further comprises summing means which are connected to the respective output signals of the one element that is associated with the influenced parameter, in order to form a modulated output signal $S_o(t)$.

In one embodiment the parameter is one of the following parameters:

a threshold level ($\gamma$) or an output level ($\delta$) of the feedback amplifier, or an integration constant ($\alpha$) of the integrator.

In a preferred embodiment the excitation means comprise a first and, respectively, second soft limiter circuit associated with the first and the second oscillator, respectively, and the parameter is the amplification (G) or the limit level ($\beta$) of the soft limiter circuit.

The quadrature modulator according to the present invention provides advantages corresponding to those of the quadrature demodulator according to the present invention, as discussed above.

In yet a further embodiment the quadrature modulator or demodulator further comprises at least one ether oscillator that is identical to the first and the second oscillator, and associated further excitation means that are equipped to derive an excitation signal for a subsequent oscillator of the at least one further oscillator from an output signal from the at least one further oscillator. This appreciably expands the number of possibilities for modulation/demodulation. In this case, however, no use is made of an orthogonal (minimal) set of basic wave forms, such as the quadrature signals in the embodiments mentioned above.

BRIEF DESCRIPTION OF THE DRAWINGS

The present invention will now be explained in more detail on the basis of a number of examples, with reference to the appended drawings, in which.

DESCRIPTION OF THE PREFERRED EMBODIMENTS

Figure 1:
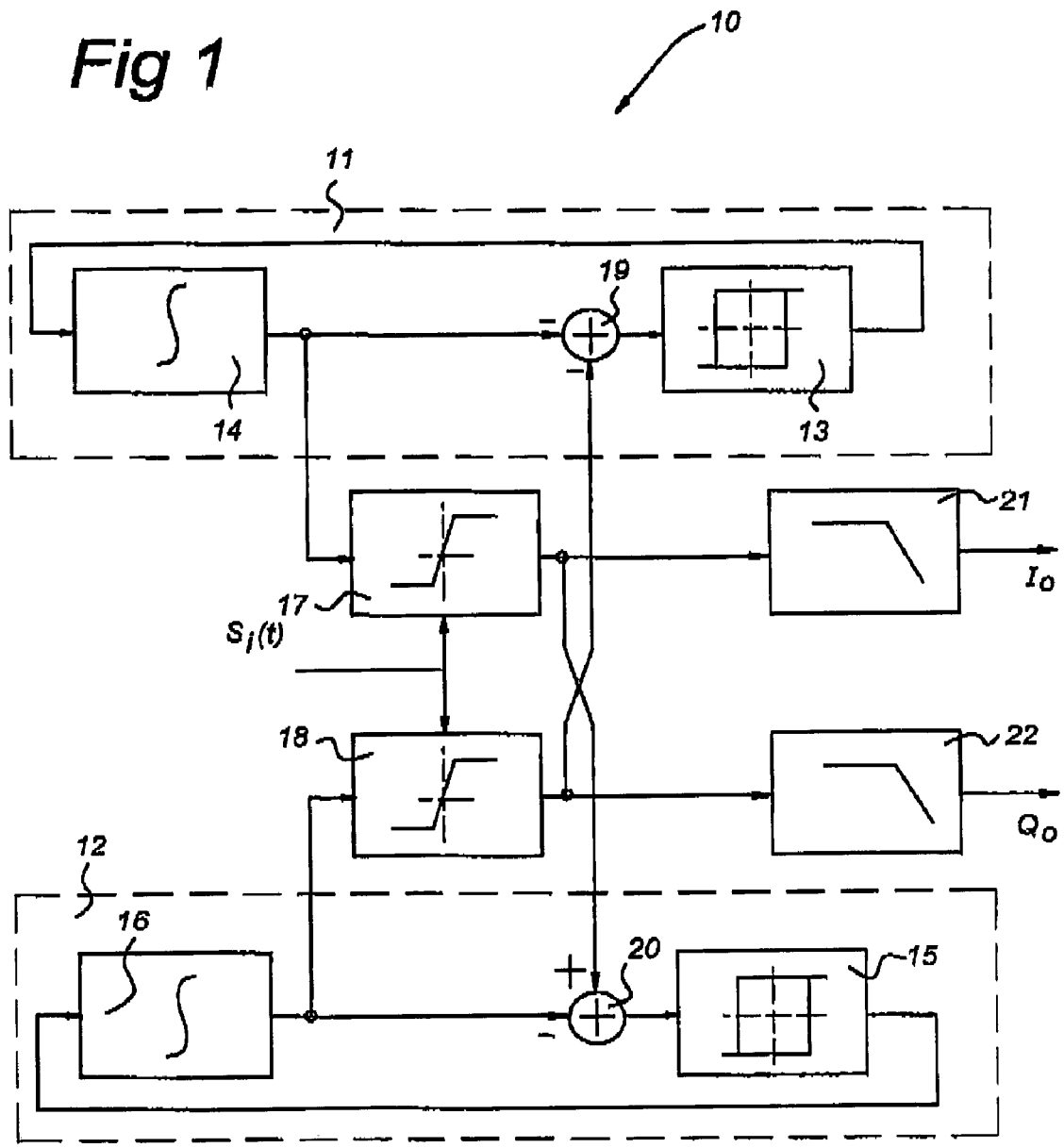
FIG. 1 shows a block diagram of one embodiment of the quadrature demodulator according to the present invention.

FIG. 1 shows a block diagram of a quadrature demodulator 10 according to one embodiment of the present invention. In the quadrature demodulator 10 in question an oscillator 11, 12 coupled in quadrature is used to generate two periodic signals which have a quadrature relationship. The negative feedback mechanism accurately maintains the quadrature phase relationship between the two periodic signals. The oscillator coupled it quadrature comprises a first oscillator 11 and a second oscillator 12, each of which has a Schmitt trigger circuit 13, 15 and an integrator circuit 14, 16. The Schmitt trigger circuit 13, 15 can be formed by a feedback amplifier and is characterised by a threshold level $\gamma$ and an output level $\delta$. The integrator circuit 14, 16 can be formed by a capacitor and is characterised by an integration constant $\alpha$. The Schmitt trigger circuit 13, 15 and integrator circuit 14, 16 are coupled to one another in a loop, that is to say an input of the Schmitt trigger circuit 13, 15 is connected to an output of the integrator circuit 14, 16 and an input of the integrator circuit 14, 16 is connected to an output of the Schmitt trigger circuit 13, 15. A signal $e_{int}(t)$, that over time, is generated with an integration constant $\alpha$ by the integration circuit 14, 16. The signal $e_{int}(t)$ is made periodic by switching between two states in which $\alpha$ and $-\alpha$, respectively, are integrated. The Schmitt trigger circuit 13, 15 switches between these two states if the output signal from the integrator circuit 14, 16 exceeds the positive or negative threshold level $\gamma$.

The accurate quadrature relationship is achieved by coupling the two oscillators 11, 12 to one another. This coupling provides a transition between two states in one of the oscillators 11, 12 by making use of the other oscillator 11, 12 as a reference. This can be implemented by means of a comparator circuit (not shown), which detects a zero passage of the output signal from the integrator circuit of the one oscillator 11, 12 and derives an excitation signal therefrom, which excitation signal is fed to the Schmitt trigger circuit 13, 15 of the other oscillator 12, 11.

However, in the embodiment sown in FIG. 1 use is made of a first and respectively, a second soft limiter circuit 17, 18. Such a circuit is characterised by a variable amplification G in a limited region of the input signal and a limit value $\beta$ ($V_{out}=-\beta$ for $V_{in}<-\beta$, $V_{out}=G*V_{in}$ for $-\beta<V_{in}<\beta$, and $V_{out}=\beta$ for $V_{in}>\beta$). An input of the first soft limiter circuit 17 is connected to the output of the first integration circuit 14, and an output of the first soft limiter circuit 17 is fed via a summing element 20 to the input of the second Schmitt trigger circuit 15. An input of the second soft limiter circuit 18 is connected to the output of the second integration circuit 16, and an output of the second soft limiter circuit 18 is fed via a summing element 19 to the input of the first Schmitt trigger circuit 13.

The coupling mechanism between the two oscillators 11, 12 is able to maintain the quadrature phase relationship if a mismatch exists between the two oscillators 11, 12. If the two oscillators 11, 12 are not yet operating in a fixed quadrature relationship, and one oscillator 11, 12 has a greater period than the other, the faster oscillator will wait until the slower oscillator 11, 12 passes through zero before it switches state and is thus delayed. The slower oscillator 11, 12 will switch over state sooner because of the faster excitation signal from the faster oscillator 11, 12 and will thus be accelerated. Ultimately the two oscillators will have the same period and will have an accurate quadrature relationship.

The behaviour of the two oscillators 11, 12 is determined by five parameters, i.e, the integration constant $\alpha$ of the integration circuit 14, 16, the limit levels $\beta$ and the amplification G of the soft limiter circuit 17, 18 and the threshold levels $\gamma$ and output levels $\delta$ of the Schmitt trigger circuit 13, 15. In the present invention these parameters are used to implement the quadrature demodulator 10. The parameters can be adjusted to the input signal $S_i(t)$ to be demodulated by incorporating a multiplier, the modulated signal $S_i(t)$ being fed to one input and the normal local oscillator signal being fed to another input.

The possibility of using the parameters $\beta$ and G of the soft limiter circuit 17, 18 to input the signal $S_i(t)$ to be demodulated into the circuit is discussed below. It is assumed that the soft limiter circuit 17, 18 is in its linear operating region. Because the circuit is set up in such a way that the Schmitt trigger circuit 13, 15 of the one oscillator 11, 12 switches over when the other oscillator 11, 12 passes through zero, this will always be the case in practice.

If the parameters are kept constant, the output signal $e_{slim}(t)$ from the soft limiter circuit 17, 18 is equal to $\beta Ge_{int}(t)$. If the parameter G is used to input the signal $S_i(t)$ to be demodulated into the oscillator 11, 12, the output signal is equal to $\beta[G+S_i(t)]e_{int}(t)$. The term $\beta S_i(t)e_{int}(t)$ is the desired output signal $I_o$ or $Q_o$, and can easily be obtained from the output signal from the soft limiter circuit 17, 18 by means of a low pass filter 21, 22. Compared with the situation with constant parameters, this signal is the only term in the output signal from the soft limiter circuit 17, 18. This additional term does not introduce any extra zero crossings if the amplitude of the signal $S_i(t)$ to be demodulated is smaller than the magnitude of the parameter G. Because no additional zero crossings are introduced, the coupled oscillator 10 will switch between the two states in the same way as in the case of constant parameters, as a result of which in this case also the quadrature phase relationship between the output signals $I_o$ and $Q_o$ remains guaranteed.

If, as an alternative, the signal $S_i(t)$ to be demodulated is input by means of the limit levels $\beta$ of the soft limiter circuit 17, 18, the output signal is given by $e_{slim}(t)=[\beta+S_i(t)]Ge_{int}(t)$. In this case the term $S_i(t)Ge_{int}(t)$ is the desired output signal $I_o$, $Q_o$. A situation arises that is comparable to that in the previous case: if the amplitude of $S_i(t)$ is less than the magnitude of $\beta$ no additional zero crossings are created. The oscillator will still change state when $e_{int}(t)$ passes through zero.

In both cases described the same results are achieved with regard to the points in time at which the oscillators 11, 12 switch. The oscillator frequency and oscillator phase are not changed, and the quadrature relationship of the quadrature output signals $I_o$ and $Q_o$ is thus maintained. The multiplication function of the signal to be demodulated and the oscillator signal is now part of the negative feedback loop of the coupled quadrature oscillator, which can correct faults that occur.

Figure 2:
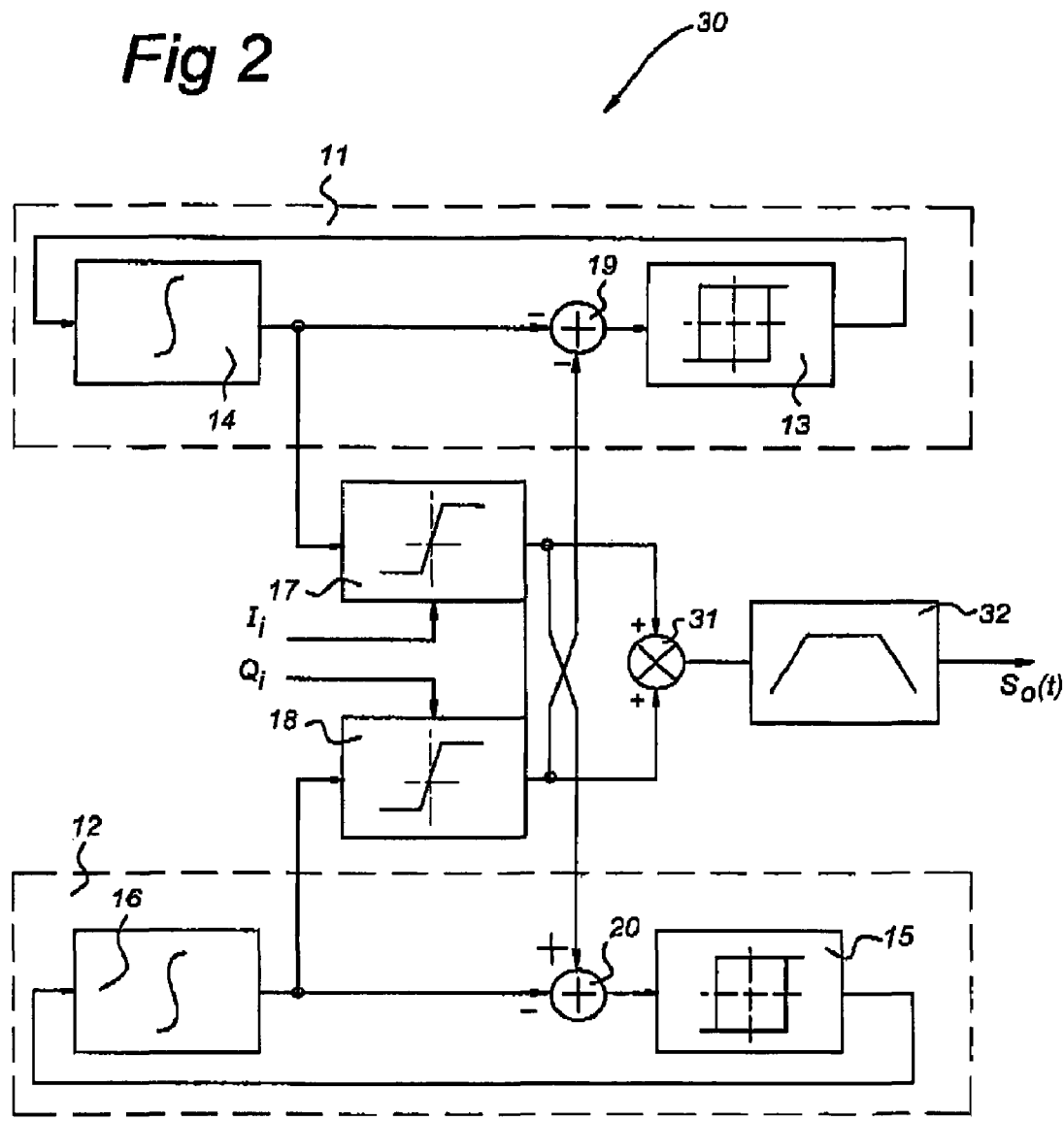
FIG. 2 shows a block diagram of one embodiment of the quadrature modulator according to the present invention.

FIG. 2 shows a quadrature modulator 30 according to the present invention. The construction and mode of operation are in broad terms identical to those of the quadrature demodulator 10 described with reference to FIG. 1. In this case, however, the quadrature input signals $I_i$ and $Q_i$ are fed to the soft limiter circuits 17 and 18, respectively, in order to influence one of the parameters $\beta$, G. and the output signals from the soft limiter circuit 17, 18 are summed in a summing device 31 and if necessary passed through a bandpass filter 32 in order to obtain the modulated RF output signal $S_o(t)$.

In order to implement the quadrature demodulator 10 and quadrature modulator 30 four subcircuits have to be designated, i.e. the integrators 14, 16, the Schmitt trigger circuits 13, 15, the summing circuits 19, 20 and the soft limiter circuits 17, 18. The four parts are described in move detail with reference to FIGS. 3 to 6.

Figure 3:
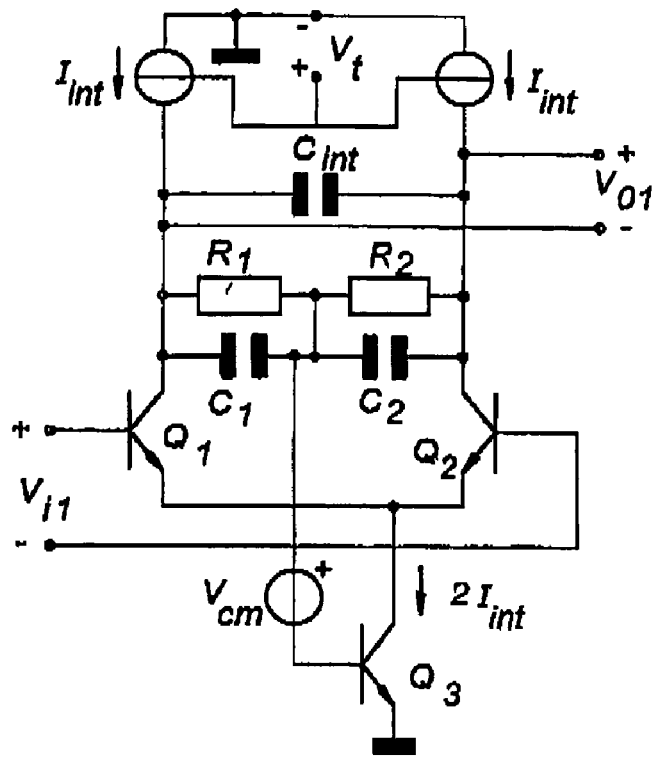
FIG. 3 shows a diagram of an integrator circuit that forms part of the quadrature modulator/demodulator according to FIGS. 1 and 2.

FIG. 3 shows a diagram of a possible implementation of the integrator 14, 16. The integrator 14, 16 can be implemented by making use of the voltage/current relationship of a capacitor $C_{int}$. The current $I_{int}$ from the current sources can be adjusted with the aid of the voltage $V_f$, and this also sets the frequency of the oscillator 11, 12. The frequency of the oscillator 11, 12 is adjustable between 1 MHz and 2 MHz. The differentially switched pair of transistors $Q_1$, $Q_2$ is used to switch the current through the capacitor $C_{int}$ between $I_{int}$ and $-I_{int}$ in response to the voltage $V_{ij}$. The resistors $R_2$, $R_3$, transistor $Q_3$ and voltage source $V_{cm}$ form a common mode loop and keep the common voltage on the collectors of $Q_1$ and $Q_2$ equal to $V_{be3}+V_{cm}$. The frequency compensation of the common node loop is effected with the capacitors $C_1$ and $C_2$. The output signal from the integrator 14, 15 is indicated by $V_{o1}$.

Figure 4:
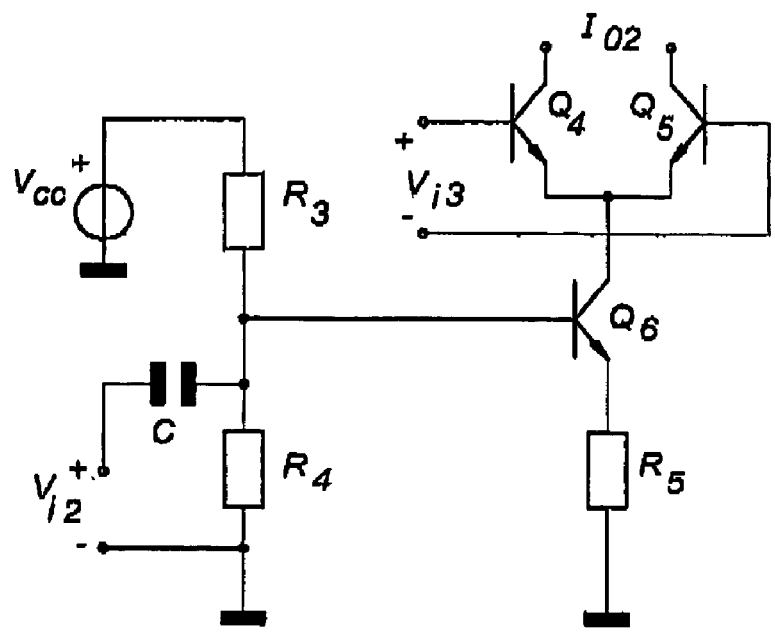
FIG. 4 shows a diagram of a soft limiter and multiplication circuit that forms part of the quadrature modulator/demodulator according to FIGS. 1 and 2.

FIG. 4 shows a diagram of a possible implementation of the soft limiter and multiplication circuit 17, 18. This soft limiter circuit 17, 18 implements the multiplication by the signal $S_i(t)$ to be demodulated and the soft-limiting function. The input signal $V_{i2}$ is connected to the output voltage $V_{o1}$ of the integrator circuit 14, 16 and the input signal $V_{i3}$ is connected to the signal $S_i(t)$ to be demodulated. A differential transistor pair $Q_4$, $Q_5$ provides the soft limiter function and, together with the transistor $Q_6$, a mixing circuit. The multiplication of $V_{i2}$ and $V_{i3}$ is present as the output signal $I_{o2}$ of the mixing circuit. The resistors $R_3$, $R_4$, and $R_5$ and the voltage source $V_{cc}$ are used to adjust the bias of the transistor $Q_6$.

Figure 5:
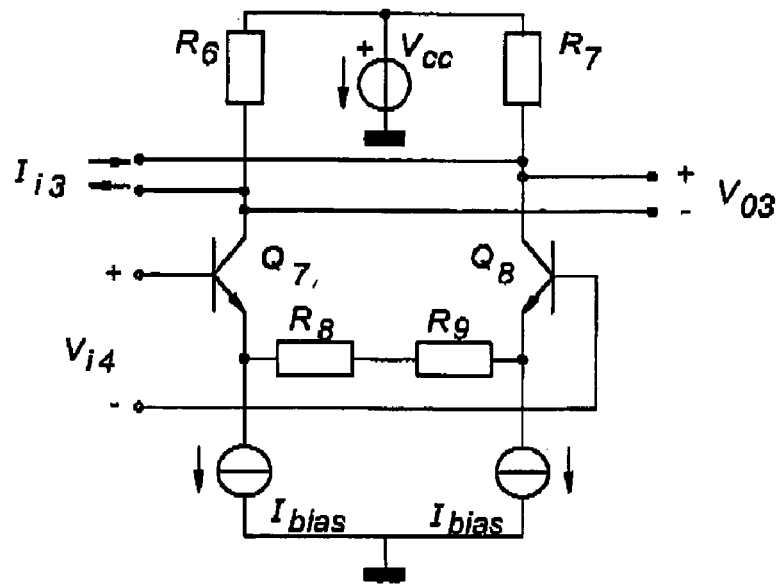
FIG. 5 shows a diagram of a summing circuit that forms part of the quadrature modulator/demodulator according to FIGS. 1 and 2.

FIG. 5 shows a diagram of a possible implementation of the summing circuit 19, 20. An input $I_{i3}$ is connected to the output of the soft limiter circuit 17, 18 and an input $V_{i4}$ is connected to the output signal $V_{o1}$ the integrator. The voltage $V_{i4}$ is converted into a current in order to make summing in the current domain possible. Transistors $Q_7$, $Q_8$ and resistors $R_8$, $R_9$ form a balanced series stage for the summation. Two resistors $R_6$ and $R_7$ are used to convert the sum of the input current $I_{i3}$ and the voltage $V_{i4}$ converted into a current into an output voltage $V_{o3}$. Voltage source $V_{cc}$ and current source $I_{bias}$ are used to bias the transistors $Q_7$, $Q_8$.

Figure 6:
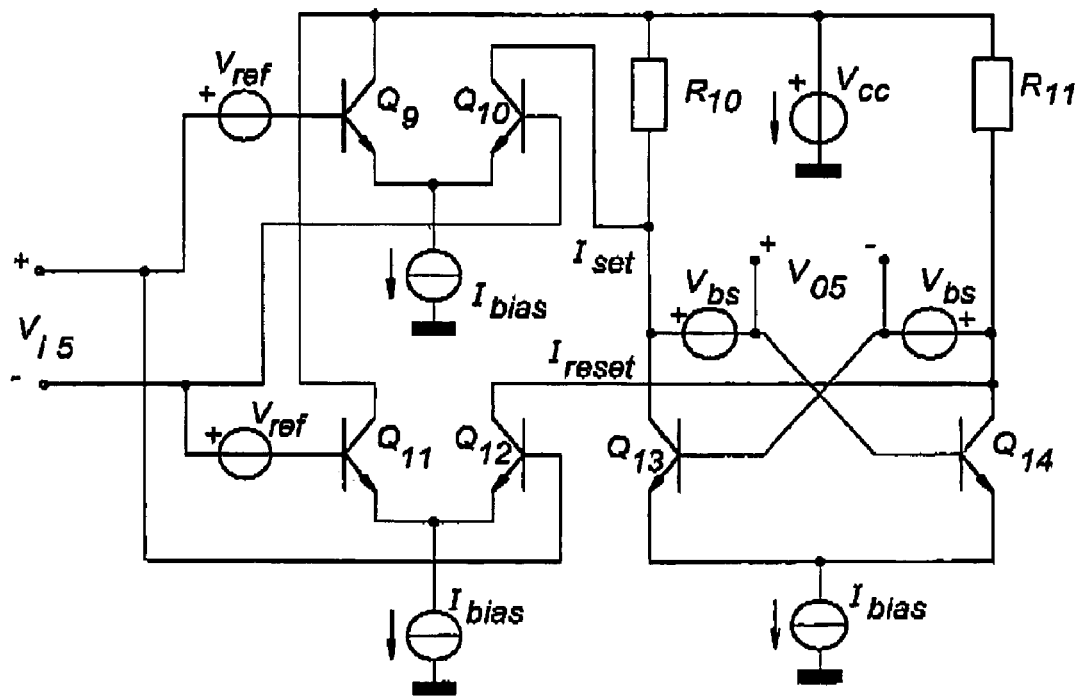
FIG. 6 shows a diagram of a Schmitt trigger circuit that forms part of the quadrature modulator/demodulator according to FIGS. 1 and 2.

FIG. 6 shows a diagram of an implementation of the Schmitt trigger circuit 13, 15. The Schmitt trigger circuit 13, 15 serves to generate two internal reference levels [$\gamma$, $-\gamma$], to compare an input signal with the two reference levels, to switch an output signal between two states and to store the current state. The two reference levels [$\gamma$, $-\gamma$] are implemented by two voltage sources, which are indicated by $V_{ref}$, and in the diagram shown are equal to a base emitter voltage $V_{be}=700$ mV. The input signal $V_{i5}$, which originates from the summing circuit 19, 20 and corresponds to the output voltage $V_{o3}$ of the summing circuit 19, 20, is compared with the two reference voltages $+V_{ref}$, $-V_{ref}$ by means of the differential transistor pairs $Q_9$, $Q_{10}$ and $Q_{11}$, $Q_{12}$, respectively. The differential transistor pairs $Q_9$, $Q_{10}$ and $Q_{11}$, $Q_{12}$ produce currents $I_{set}$ and $I_{reset}$ as output signal. Switching between two states and storage of the current state are implemented by means of a circuit which comprises a limiter in a positive feedbacks. The limiter is implemented by means of differential transistor pair $Q_{13}$, $Q_{14}$. A positive feedback of the limiter is implemented by means of a current/voltage converter, formed by resistors $R_{10}$ and $R_{11}$. The positive feedback ensures that the output signal from the limiter $Q_{13}$, $Q_{14}$ has one of two possible output values. If the signal at the input of the limiter $Q_{13}$, $Q_{14}$ passes through zero, the positive feedback ensures that the output signal of the limiter $Q_{13}$, $Q_{14}$ switches to the other output value. Furthermore, the Schmitt trigger circuit 13, 15 contains voltage sources $V_{bs}$ in order to provide the transistors $Q_{13}$, $Q_{14}$ with a bias and as a level shift in the common mode. The currents $I_{set}$ and $I_{reset}$ are the input signals for the limiter and are summed with the output current from the limiter $Q_{13}$, $Q_{14}$. The currents $I_{set}$ and $I_{reset}$ must be greater than the output current from the limiter $Q_{13}$. $Q_{14}$ in order to initiate changeover to the other state. The bias of the transistors $Q_9$ . . . $Q_{14}$ is adjusted using a voltage source $V_{cc}$ and current sources $I_{bias}$. The voltage between the respective bases of transistors $Q_{13}$, $Q_{14}$ gives the output voltage $V_{o5}$ of the Schmitt trigger circuit 13, 15. This output voltage $V_{o5}$ is fed as input voltage $V_{i1}$ to the integrator 14, 16.

The Schmitt trigger circuit 13, 15 and the soft limiter circuit 17, 18 can be implemented with the aid of the same sort of elements, for example an amplifier having a non-linear (limiting) transmission. In the examples described above the elements are implemented with complementary switched transistors.

The quadrature modulator or demodulator can comprise multiple oscillators 11, 12 and associated excitation means, such as the soft limiter circuits 17, 18, This appreciably expands the number of possibilities for modulation/demodulation. In this case, however, no use is made of an orthogonal (minimal) set of basic wave forms, such as the quadrature signals in the abovementioned embodiments.

The present invention has been explained above on the basis of a few illustrative embodiments. It will be clear to those skilled in t he art that variations and other implementations are possible. These variations and other implementations are considered to be covered by the scope of protection that is defined by the appended claims.

The invention claimed is:

1. Quadrature demodulator (10) comprising a first oscillator (11) and a second oscillator (12),
    wherein the first oscillator (11) comprises a feedback amplifier (13, 15) and an integrator (14, 16), an output of the feedback amplifier (13, 15) is connected to an input of the integrator (14, 16), and an output of the integrator (14, 16) is connected to an input of the feedback amplifier (13, 15),
    the first oscillator (11) has two stable states which alternate with one another in an oscillation period and a non-stable or regenerative state between the two stable states, and a separate excitation signal is fed to the first oscillator (11) in order to determine the point in time at which switching between the two stable states takes place,
    the second oscillator (12) is identical to the first oscillator (11), and the quadrature demodulator (10) further comprises first and second excitation means (17, 18), respectively, which are equipped to derive an excitation signal for the second and the first oscillator (12, 11), respectively, from an output signal from the first and the second oscillator (11, 12), respectively, and
    wherein an input signal $S_i(t)$ is fed to the quadrature demodulator (10) by means of which a parameter of one of the elements of the first and the second oscillator (11, 12) is influenced, the elements comprising the feedback amplifier (13, 15), integrator (14, 16) or excitation means (17, 18), and a set of quadrature output signals $I_o$, $Q_o$ is fed to the outputs of the respective one element that is associated with the influenced parameter.

2. Quadrature demodulator according to claim 1, wherein the parameter is one of the following parameters:
    a threshold level ($\gamma$) or an output level ($\delta$) of the feedback amplifier (13, 15), or an integration constant ($\alpha$) of the integrator (14, 16).

3. Quadrature demodulator according to claim 1, wherein the excitation means (17, 18) comprise a first and, respectively, second soft limiter circuit associated with the first and the second oscillator (11, 12), respectively, and the parameter is the amplification (G) or the limit level ($\beta$) of the soft limiter circuit (17, 18).

4. Quadrature modulator (30) comprising a first oscillator and a second oscillator (11, 12),
    wherein the first oscillator (11) comprises a feedback amplifier (13, 15) and an integrator (14, 16), an output of the feedback amplifier (13, 15) is connected to an input of the integrator (14, 16), and an output of the integrator (14, 16) is connected to an input of the feedback amplifier (13, 15),
    the first oscillator (11) has two stable states which alternate with one another in an oscillation period and a non-stable or regenerative state between the two stable states, and a separate excitation signal is fed to the first oscillator (11) in order to determine the point in time at which switching between the two stable states takes place, the second oscillator (12) is identical to the first oscillator (11),
    the quadrature modulator (30) further comprises first and second excitation means (17, 18), respectively, which are equipped to derive an excitation signal for the second and the first oscillator (12, 11), respectively, from an output signal from the first and the second oscillator (11, 12), respectively, and
    wherein a first quadrature signal and a second quadrature signal are fed to the quadrature modulator (30), by means of which signals a parameter of one of the respective elements of the first and the second oscillator (11, 12) is influenced, the elements comprising the feedback amplifier (13, 15), integrator (14, 16) or excitation means (17, 18), and the quadrature modulator (30) further comprises summing means (31) which are connected to the respective output signals of the one element that is associated with the influenced parameter, in order to form a modulated output signal $S_o(t)$.

5. Quadrature modulator according to claim 4, wherein the parameter is one of the following parameters:
    a threshold level ($\gamma$) or an output level ($\delta$) of the feedback amplifier (13, 15), or an integration constant ($\alpha$) of the integrator (14, 16).

6. Quadrature modulator according to claim 4, wherein the excitation means (17, 18) comprise a first and, respectively, second soft limiter circuit associated with the first and the second oscillator (11, 12), respectively, and the parameter is the amplification (G) or the limit level ($\beta$) of the soft limiter circuit (17, 18).

* * * * *